US012628489B2

(12) United States Patent
Hutzler

(10) Patent No.: US 12,628,489 B2
(45) Date of Patent: May 12, 2026

(54) TRANSISTOR DEVICE

(71) Applicant: Infineon Technologies Austria AG, Villach (AT)

(72) Inventor: Michael Hutzler, Villach (AT)

(73) Assignee: Infineon Technologies Austria AG, Villach (AT)

( * ) Notice: Subject to any disclaimer, the term of this patent is extended or adjusted under 35 U.S.C. 154(b) by 396 days.

(21) Appl. No.: 18/487,255

(22) Filed: Oct. 16, 2023

(65) Prior Publication Data

US 2024/0065006 A1 Feb. 22, 2024

(30) Foreign Application Priority Data

Nov. 3, 2022 (EP) ..................................... 22205222

(51) Int. Cl.
H10K 10/46 (2023.01)
H10K 10/82 (2023.01)

(52) U.S. Cl.
CPC ......... H10K 10/491 (2023.02); H10K 10/481 (2023.02); H10K 10/82 (2023.02)

(58) Field of Classification Search
CPC .. H10K 10/484; H10K 10/491; H10D 30/668; H10D 30/0297; H10D 64/513
See application file for complete search history.

(56) References Cited

U.S. PATENT DOCUMENTS

2004/0108569 A1 6/2004 Breen et al.
2005/0071969 A1 4/2005 Sirringhaus et al.

2006/0223218 A1 10/2006 Huitema et al.
2008/0220562 A1 9/2008 Dimmler et al.
2009/0166686 A1 7/2009 Hunt et al.
2016/0336441 A1 11/2016 Nakano et al.
2019/0181051 A1 6/2019 Anderson et al.
2019/0214343 A1 7/2019 Lee et al.
2020/0176611 A1 6/2020 Lee et al.

(Continued)

FOREIGN PATENT DOCUMENTS

CN 116761479 A * 9/2023 ............. H10K 71/12

OTHER PUBLICATIONS

Liu, Jinyu & Qin, Zhengsheng & Gao, Haikuo & Dong, Huanli & Jia, Peng & Hu, Wenping. (2019). Vertical Organic Field-Effect Transistors. Advanced Functional Materials. 29. 10.1002/adfm. 201808453 (Year: 2019).*

(Continued)

*Primary Examiner* — Alia Sabur

(74) *Attorney, Agent, or Firm* — Murphy, Bilak & Homiller, PLLC

(57) ABSTRACT

In an embodiment, a transistor device includes: a support layer having a first major surface and a second major surface opposing the first major surface; a source contact arranged on the first major surface of the support layer; a drain contact arranged on the second major surface of the support layer; and a gate electrode arranged in a first trench formed in the first major surface of the support layer. The first trench has a base and a side wall extending from the base to the first major surface. The drain contact is arranged under the base of the first trench. A region with gate-controlled conductivity is formed between the source contact and the drain contact. The region with gate-controlled conductivity is formed in an organic semiconductor layer.

16 Claims, 6 Drawing Sheets

(56) References Cited

U.S. PATENT DOCUMENTS

| 2021/0013108 A1 | 1/2021 | Wu et al. |
| 2021/0280680 A1* | 9/2021 | Xu ..................... H10D 62/157 |
| 2021/0343938 A1 | 11/2021 | Park et al. |

OTHER PUBLICATIONS

Parashkov, et al., "Vertical channel all-organic thin-film transistors", Applied Physics Letters, vol. 82, No. 25, Jun. 23, 2003, pp. 4579-4580.

"Wikipedia—Organic field-effect transistor", pp. 1-6.

Horowitz, Gilles, "Organic Field-Effect Transistors", Advanced Materials, vol. 10, No. 5, 1998, pp. 365-377.

Sirringhaus, Henning, "25th Anniversary Article: Organic Field-Effect Transistors: The Path Beyond Amorphous Silicon", Advanced Materials, vol. 26, 2014, pp. 1319-1335.

Stutzmann, Natalie, et al., "Self-Aligned, Vertical-Channel, Polymer Field-Effect Transistors", Science, vol. 299, www.sciencemag.org, Mar. 21, 2003, pp. 1881-1884.

* cited by examiner

TRANSISTOR DEVICE

BACKGROUND

Transistors used in power electronic applications may be fabricated with silicon (Si) semiconductor materials. Common transistor devices for power applications include Si Power MOSFETs such as Si CoolMOS® and Si Insulated Gate Bipolar Transistors (IGBTs).

Transistor devices may also be formed using other semiconductor materials including organic semiconductors. US 2006/0223218 A1 discloses a lateral field effect transistor with an organic semiconductor, in particular a device comprising a plurality of field effect transistors with an interconnect structure. The transistor is provided in a top-gate structure and the organic semiconductor layer and the dielectric layer are structured and patterned together. The semiconductor layer and the dielectric layer may be removed from areas not associated with field effect transistors or with crossing conductors of first and second conductor layers. The organic semiconductor material may be formed of pentacene, for example. Organic transistor devices may be used in displays, for example.

It is desirable to provide organic transistor devices which are suitable for a use in a wider range of applications.

SUMMARY

In an exemplary embodiment, a transistor device comprises a support layer having a first major surface and a second major surface opposing the first major surface, a source contact arranged on the first major surface of the support layer, a drain contact arranged on the second major surface of the support layer and a gate electrode. The gate electrode is arranged in a first trench formed in the first major surface of the support layer, the first trench having a base and a side wall extending from the base to the first major surface. The drain contact is arranged under the base of the first trench. The transistor device further comprises a region with gate-controlled conductivity formed between the source contact and the drain contact. The region with gate-controlled conductivity is formed in an organic semiconductor layer.

The transistor device can be considered to have a trench-based transistor structure and also a vertical trench-based transistor structure since the source and drain contacts are arranged on opposing major surfaces of the support layer. The organic semiconductor layer comprises the region with gate-controlled conductivity that provides the channel of the transistor. The organic semiconductor layer, in which the region with gate-controlled conductivity Is formed, may extend at least in part substantially perpendicularly between the first and second major surface of the support layer and between the source and drain contacts. A vertical organic semiconductor-based power FET is provided.

The transistor device may comprise a plurality of transistor unit cells that are electrically connected in parallel such that high current levels can be switched. Each transistor unit cell comprises a source contact, a drain contact and a gate electrode arranged in a first trench. A single drain contact that is common to these transistor unit cells may be provided on the second major surface. A single source contact that is common to these transistor cells may be provided on the first major surface or one source contact for each transistor unit cell or one source contact for two adjoining transistor unit cells may be provided on the first major surface. In arrangements including two or more source contacts, these may be electrically connected together by a source bus that is arranged on the first major surface.

The first trench comprises a side wall that extends from the base to the first major surface of the support layer. The base of the trench may be rounded or substantially planar and have an area that is substantially the same as the area of the opening of the trench at the first major surface, for example the difference between the area of the base and the area of the opening may be within ±10%. The sidewall may extend substantially perpendicularly to the first major surface. The drain contact is arranged under the base of the first trench and may extend under the entire width of the first trench. The drain contact may extend over the entire second major surface of the support layer.

The organic semiconductor layer may comprise a conjugated polymer or small-molecule organic semiconductor. In some embodiments, the organic semiconductor comprises pentacene, poly (3-hexylthiophene) (P3HT), poly (3-alkylthiophene) (P3AT), poly (3-octylthiophene) (P3OT) or Polyvinylephenyle (PVP). The organic semiconductor layer may have a first conductivity type, for example p-type.

In some embodiments, the support layer is formed of a dielectric material and the organic semiconductor layer is arranged on the base and sidewall of the first trench. The dielectric material may be Poly-methyl-methacrylate (PMMA) or poly-ethylene-terephthalate (PET) or PVC (Poly Vinyl Chloride), for example. The organic semiconductor layer may have the form of a lining that lines the first trench. A gate dielectric layer is arranged on the organic semiconductor layer that is arranged on the base and the side wall of the first trench. The gate electrode is arranged on the gate dielectric layer. The gate electrode may fill the remainder of the first trench. The gate dielectric layer electrically insulates the gate electrode arranged in the first trench from the organic semiconductor layer.

In some embodiments, the transistor device further comprises a source layer that is arranged on the source contact and a drain layer that is arranged on the drain contact. The source contact may extend over the entire first major surface of the support layer and have the form of a layer. The drain contact may extend over the entire second major surface of the support layer and have the form of a layer.

In some embodiments, a plurality of strip-like source layers is provided that are separate from one another. In some embodiments, a plurality of strip-like source contacts is provided that are separate from one another and one separate strip-like source layer is arranged on each strip-like source contact. The strip-shaped source contacts and source layers may extend substantially parallel to one another.

The source layer and the drain layer are electrically conductive and may comprise a metal or alloy. The source layer may be referred to as a source power layer and the drain layer as a drain power layer. The source layer may have a thickness that is greater than the thickness of the source contact, for example may be at least twice as thick. The drain layer may have a thickness that is greater than the thickness of the drain contact, for example may be at least twice as thick.

The source contact and the drain contact are electrically conductive and may be formed of one or more metal, for example, and/or may include two or more sublayers of differing composition.

In some embodiments, the source contact, that is arranged on the first major surface, is located adjacent the side wall of the first trench and forms part of the side wall of the first trench. The source contact may have the form of a layer which extends laterally over the first major surface and the first trench extends through the source contact into the support layer.

In some embodiments, the organic semiconductor layer further extends over a part of the source contact that is arranged on the first major surface of the support layer. The gate dielectric layer extends over the organic semiconductor layer that is arranged on the source contact. In this embodiment, the organic semiconductor layer and the gate dielectric layer not only line the base and sidewall of the first trench but also extend laterally adjacent the first trench and onto the first major surface of the support layer.

In embodiments, in which the transistor device further comprises a source layer that is arranged on the source contact, the source layer is located between the source contact and the organic semiconductor layer that is arranged laterally adjacent the first trench on the first major surface of the support layer. In other words, the organic semiconductor layer extends over the upper surface of the source layer and the gate dielectric layer extends over the organic semiconductor layer that is arranged on the upper surface of the source layer.

In some embodiments, the source layer extends over the entire first major surface of the support layer and forms a part of the side wall of the first trench. The first trench extends through the source layer, the source contact and into the first major surface of the support layer.

In some embodiments, the support layer is formed of at least one organic semiconductor and a gate dielectric layer is arranged on the base and side walls of the first trench and electrically insulates the gate electrode in the first trench from the support layer. the organic semiconductor comprises pentacene, poly (3-hexylthiophene) (P3HT), poly (3-alkyl-thiophene) (P3AT), poly (3-octylthiophene) (P3OT) Poly-vinylephenyle (PVP) or polymethylmethacrylate (PMMA). The organic semiconductor layer may have a first conductivity type, for example p-type.

In these embodiments in which the support layer comprises the organic semiconductor material, the gate dielectric layer is arranged directly on the base and side walls of the trench and the gate electrode is arranged on the gate dielectric layer and may fill the first trench. In these embodiments, the first trench is free of the organic semiconductor material in which the region with gate-controlled conductivity, i.e. channel, of the transistor device is formed. The region with gate-controlled conductivity, i.e. the channel of the transistor device, is formed in the support layer and between the source and drain contacts arranged on the opposing major surfaces of the support layer.

In embodiments, in which the support layer is formed of at least one organic semiconductor the transistor device may further comprise a source layer that is arranged on the source contact and a drain layer that is arranged on the drain contact.

In some embodiments, the source contact is located adjacent the side wall of the first trench and may form a portion of the side wall of the first trench and the gate dielectric layer further extends over a part of the source contact. In some embodiments, the source contact extends over the entire first major surface of the support layer and forms a part of the side wall of the first trench.

In some embodiments, the transistor device further comprises a source layer that is arranged on the source contact and between the source contact and the gate dielectric layer that is arranged on the first major surface of the support layer. In other words, the gate dielectric layer extends over the upper surface of the source layer.

In some embodiments, the support layer comprises two or more sublayers. In some embodiments, the support layer has an upper sublayer and a lower sublayer and the upper sublayer and the lower sublayer have different doping concentrations. The upper sublayer and the lower sublayer comprise the same conductivity type, for example p-type or n-type, but different doping concentrations. The upper sublayer is arranged on and forms and interface with the lower sublayer so that the upper sublayer provides the first major surface and the lower sublayer the second major surface of the support layer. The doping concentration of the upper sublayer may be lower than the doping concentration of the lower sublayer. The support layer has a doping profile of dopants of the first conductivity type. The doping profile has in the vertical direction, i.e. in a direction perpendicular to the first and second major surfaces, a step or abrupt change in the concentration of these dopants.

In some embodiments, the support layer comprises a vertical doping gradient. The support layer has a doping profile of dopants of the first conductivity type that in the vertical direction, i.e. in a direction perpendicular to the first and second major surfaces, has a continuous change in doping concentration, without a step or abrupt change in the concentration of these dopants. The doping concentration may increase or decrease in a direction form the second major surface to the first major surface in order to provide a doping profile with a vertical doping gradient that is inclined or sloped. Such a vertical doping gradient can also be described as a graded doping profile and the slope or gradient may be positive or negative, i.e. the doping concentration may increase or decrease in a direction from the second major surface towards the first major surface. In these embodiments, the drain contact formed at the second major surface may be formed by the doped region of the support substrate located adjacent to the second major surface.

In some embodiments, the source contact and the drain contact are formed by a doped layer formed in the material of the support layer at the first and second major surface, respectively. In other embodiments, the source contact and the drain contact may be formed by an additional layer that is formed on the first and second major surface, respectively, of the support layer. In some embodiments, the source contact and the drain contact are formed by one or more metal layers.

In some embodiments, the source layer may comprise a plurality of strips or may extend over the entire first major surface of the support layer and forms a part of the side wall of the first trench. The first trench extends through the source layer, the source contact and into the first major surface of the support layer.

The source layer may be referred to a power metal layer and may have a thickness that is greater than the thickness of the source contact, for example may be at least twice as thick. The drain layer may be referred to a power metal layer and may have a thickness that is greater than the thickness of the drain contact, for example may be at least twice as thick.

In some embodiments, the transistor device further comprises a field plate. The field plate may be electrically coupled to source potential or to gate potential or may be electrically floating.

In some embodiments, the field plate is arranged in the first trench and under the gate. The field plate is electrically insulated from the support layer by a field insulator. The field insulator is located on the base and sidewall of the first trench and may have the form of a dielectric or electrically insulating layer that is located between the side wall of the field plate and the sidewall of the first trench and between the lower surface of the field plate and the base of the first trench. The field isolator may have a thickness that is greater than the thickness of the gate dielectric layer that is arranged between the gate electrode and the sidewall of the first trench, for example between the side wall of the gate electrode and the sidewall of the first trench.

In some embodiments, the field plate is electrically insulated from the gate electrode by an intermediate electrically insulating layer that is arranged in the first trench. The intermediate electrically insulating layer extends between the upper surface of the field plate and the lower surface of the gate electrode. In these embodiments, the field plate may be connected to source potential or be electrically floating, for example. In some embodiments, the field plate is integral with the gate electrode and electrically connected to gate potential.

The first trench may be elongate and have a stripe-like form. In these embodiments, the sidewall of the first trench has four sub walls that are arranged substantially perpendicularly to one another so that the first trench has a substantially rectangular shape when viewed from above. The first trench with an elongate stripe-like form has a length which extends parallel to the first major surface, its length being greater, e.g. at least twice, than its depth from the first major surface perpendicular to the first major surface and which is in turn greater than its width. The gate electrode and, if present, the field plate within the first trench also has an elongate stripe-like form.

In other embodiments, the first trench has a columnar or needle type shape. A columnar or needle-shaped trench has a small or narrow circumference or width in proportion to its height/depth in the substrate. For example, the depth is at least twice the width. The gate electrode and field plate, if present, positioned in the trench also have a columnar or needle shape. A columnar or needle trench may have an octagonal, circular, square, hexagonal and shape in plan view. The columnar trenches and consequently the gate electrode and field plate, if present, positioned in the first trench may be arranged in a regular square grid array of rows and columns, or an offset rows or a hexagonal array, for example.

In embodiments in which the first trench is columnar or needle-shaped, the first trench has a single side wall if it is circular in plan view, and is divided into four sub walls arranged substantially perpendicularly to one another if it is square in plan view, six sub walls if it is hexagonal in plan view etc.

In some embodiments, the transistor device further comprises a second trench that is positioned laterally adjacent the first trench and that extends into the first major surface of the support layer and has a base and a side wall that extends from the base to the first major surface. A field plate is arranged in the second trench and is electrically insulated from the support layer by a field insulator that lines the base and side walls of the second trench. In these embodiments, the first trench includes the gate electrode only.

In embodiments including a second trench, the second trench may be elongate and have a stripe-like form or columnar. In an embodiment, the second trench in which the field plate is located is columnar and the first trench in which the gate electrode is located is elongate. The columnar second trenches and the columnar field plates may be arranged in a regular array, e.g. an array of equally spaced rows and columns, and the first trench and the gate electrode have the form of a square grid with transverse and longitudinal portions, one portion being positioned between neighbouring rows or columns of the second trenches.

In some embodiments, the transistor device further comprises a gate metal layer arranged on the gate electrode in the first trench. The gate electrode may fill the first trench. The gate metal layer may have an elongate strip-like structure and may extend onto the first major surface of the support substrate. The gate metal layer may be laterally wider than the first trench and extend over the gate dielectric layer that is positioned on the first major surface of the support layer and laterally adjacent to the first trench.

In some embodiments, the first trenches are columnar and one gate metal layer extends over a plurality of first trenches and electrically connects the plurality of first trenches to one another.

In embodiments in which the first trench is columnar, a plurality of first trenches may be provided that are arranged in a row. One strip-like gate metal layer may be used to electrically couple the columnar gate electrodes arranged in one row to one another. The gate metal layer may extend over and between individual ones of the plurality of gate trenches of that row to electrically couple the gate electrodes to one another.

In some embodiments, the source contact has an elongate strip-like structure and extends substantially parallel to the elongate strip-like structure of the gate metal layer on the first major surface of the support substrate. If the first trench has an elongate form, the source contact may also have an elongate form and extend substantially parallel to the first trench and elongate gate electrode in the first trench.

In some embodiments, the gate metal layer extends over part of the source contact and, if present, part of the source layer arranged on the source contact. In other embodiments, the gate metal layer is laterally spaced apart from the source contact and source layer, if present.

In some embodiments, the transistor device comprises a plurality of first trenches, a plurality of gate metal layers, a plurality of source contacts and a plurality of source layers, one source layer being arranged on one source contact.

In some embodiments, each of the gate metal layers, source contacts and source layers have an elongate strip-like shape. Each gate metal layer may be electrically connected to a single elongate gate electrode in an elongate first trench or to a plurality of columnar gate electrodes arranged in respective columnar first trenches.

In some embodiments, one gate metal layer is arranged on one first trench, one source contact is arranged between adjacent ones of the first trenches and one source layer is arranged on each of the source contacts. The source layers and gate metal layers may extend substantially parallel to one another and be alternately arranged.

In some embodiments, a source bus extends on the first major surface of the support layer between adjacent ones of the source layers and electrically connects separate source layers to one another. Each source layer may be arranged on and electrically connected to a source contact that is electrically separate from the other source contacts. The source bus is electrically conductive and may be formed of the same of different material to the source layer. In some embodiments, a gate bus extends on the first major surface of the support layer between adjacent ones of the separate gate metal layers. The gate bus electrically connects the separate gate metal layers and gate electrodes to one another. Each gate metal layer may be electrically connected to a single elongate gate electrode in an elongate first trench or to a plurality of columnar gate electrodes arranged in respective columnar first trenches.

In an exemplary embodiment, a method for fabricating a transistor device is provided. The method comprises providing a drain layer, forming a drain contact on the drain layer, forming an organic semiconductor layer on the drain contact, forming a source contact on the organic semiconductor layer, forming a source layer on the source contact, forming a first trench that extends through the source layer, the source contact and into the organic semiconductor layer, the first trench having a base and a side wall, forming a gate dielectric layer on the base and the side wall of the first trench and forming a gate electrode on the gate dielectric layer in the first trench. The processes of the method may be carried out in this order.

In an exemplary embodiment, a method for fabricating a transistor device is provided. The method comprises providing a drain layer, forming a drain contact on the drain layer, forming a dielectric layer on the drain contact, forming a source contact on the dielectric layer, forming a source layer on the source contact, forming a first trench that extends through the source layer, the source contact and into the dielectric layer, the first trench having a base and a side wall, forming an organic semiconductor layer on the base and the side wall of the first trench, forming a gate dielectric layer on the organic semiconductor layer and forming a gate electrode on the gate dielectric layer in the first trench. The processes of the method may be carried out in this order.

In some embodiments, the drain layer comprises a flexible, electrically conductive foil and/or the source layer comprises a flexible, electrically conductive foil.

In some embodiments, the drain layer comprises a metal such as Cu, Al, or a conductive material such as indium-tin-oxide (ITO), or a conductive polymer and/or the source layer comprises a metal such as Cu, Al, or a conductive material such as indium-tin-oxide ITO, or a conductive polymer.

In some embodiments, the drain contact comprises Au or indium-tin-oxide (ITO) and/or the source contact comprises Au or indium-tin-oxide (ITO)

In some embodiments, the organic semiconductor layer comprises small molecules such as Oligothiophenes, Pentacene, Benzodithiophene or certain polymers.

In some embodiments, the dielectric layer comprises Poly-methyl-methacrylate (PMMA) or poly-ethylene-terephthalate (PET) or PVC (Poly Vinyl Chloride)

In some embodiments, the gate dielectric layer is formed of poly-Imide or PMMA, or an inorganic dielectric material such as $SiO_2$ or SiN In some embodiments, the gate electrode is formed of Au.

A further gate metal layer may be formed on the gate electrode.

In some embodiments, the first trench has a strip- or needle-shape.

The first trench may be formed by etching. In some embodiments, the first trench is defined by a lithography process and its base may be positioned on and formed by the drain contact, for example for a first trench formed in a dielectric layer, or the base of the first trench may be positioned within the organic semiconductor layer and spaced apart from the drain contact by a portion of the organic semiconductor layer.

In embodiments in which the organic semiconductor layer is formed on the drain contact and the first trench is subsequently formed in the organic semiconductor layer, the organic semiconductor layer may be deposited by spin coating, vacuum evaporation, or pulsed laser deposition.

In embodiments in which the organic semiconductor layer is formed on the drain contact and the first trench is subsequently formed in the organic semiconductor layer, the gate dielectric layer and the gate metal layer are further formed over the source layer and, in a further lithography process, are subsequently structured, e.g. etched or removed by alternative process, with a stop on the source layer.

In embodiments in which the first trench is formed in a dielectric layer, the organic semiconductor layer may be deposited onto the base and side wall of the first trench, by spin coating, vacuum evaporation, or pulsed laser deposition.

In embodiments in which the first trench is formed in a dielectric layer, the organic semiconductor layer, the gate dielectric layer and the gate metal layer are further formed over the source layer and in a further lithography process, are subsequently structured, e.g. etched or removed by alternative process, with a stop on the source layer.

In some embodiments, one or more passivation layers are formed over the first and second major surfaces. In some embodiments, the passivation layer comprises an electrically isolating polymer layer, e.g. Poly-Imide or PMMA.

In some embodiments, the passivation layer is structured and exposes regions of the source and drain layers which form the desired contact areas.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Exemplary embodiments are depicted in the drawings and are detailed in the description which follows.

DETAILED DESCRIPTION

Figures 1, 2A, 2B:
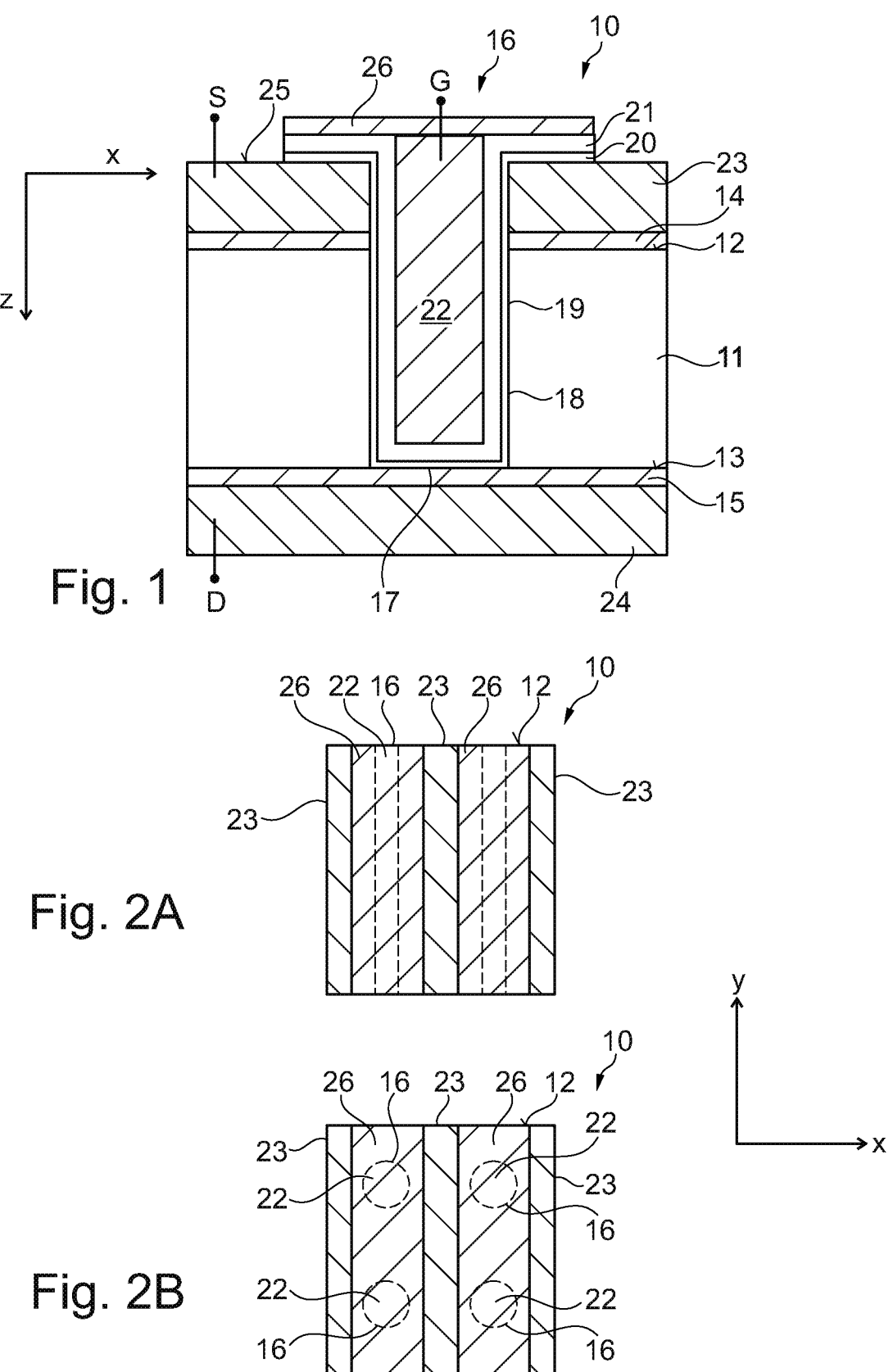
FIG. 1 illustrates a cross-sectional view of a transistor device according to an embodiment.
FIGS. 2A and 2B illustrate two top views of a transistor device which may have a cross-sectional structure as shown in any one of FIGS. 1, 3 to 6.

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of exemplary embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present.

As employed in this specification, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As used herein, various device types and/or doped semiconductor regions may be identified as being of n type or p type, but this is merely for convenience of description and not intended to be limiting, and such identification may be replaced by the more general description of being of a "first conductivity type" or a "second, opposite conductivity type" where the first type may be either n or p type and the second type then is either p or n type.

The figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

A vertical organic semiconductor-based power FET (Field Effect Transistor) device is provided in which the conduction occurs in an organic semiconductor material and substantially vertically, i.e. substantially perpendicularly to the major surfaces of the support layer since the source and drain are arranged on opposing sides of the support layer. This arrangement is in contrast to a lateral organic FET in which the source and drain are arranged on the same side of a support layer and the conduction occurs substantially parallel to the major surfaces of the support layer. Organic FETs are useful in application fields where mechanical flexibility or light weight of the devices are desirable.

FIG. 1 illustrates a cross-sectional view of a transistor device 10 according to an embodiment. The transistor device 10 comprises a support layer 11 having a first major surface 12 and a second major surface 13 that opposes the first major surface 12. The transistor device 10 comprises a source contact 14 which is arranged on or at the first major surface 12 of the support layer 11 and a drain contact 15 which is arranged on or at second major surface 13 of the support layer 11. A first trench 16 is formed in the first major surface 12 of the support layer 11 which comprises a base 17 and a sidewall 18 which extends from the base 17 to the first major surface 12 of the support layer 11. The drain contact 15 is arranged under the base 17 of the trench 16. The drain contact 15 may extend over the entire second major surface 13 and be positioned not only vertically under the base 17 of the trench 16 but also laterally adjacent the side walls 18 of the trench 16. In some embodiments, such as that illustrated in FIG. 1, the first trench 16 has a depth such that the base 17 is formed by portion of the drain contact 15.

The support layer 11 may have a planar form so that that the opposing first and second major surfaces 12, 13 are substantially parallel to one another. The sidewall 18 of the trench first trench 16 may extend substantially perpendicularly to the first major surface 12. The base 17 of the first trench 16 may be substantially planar or have a rounded shape. The drain contact 15 may extend uninterruptedly under the entire area of the base 17 of the first trench 16.

The transistor device 10 further comprises a region 19 with gate-controlled conductivity which is formed between the source contact 14 on the first major surface 12 and the drain contact 15 on the second major surface 13. The region 19 with gate-controlled conductivity is formed in an organic semiconductor layer 20 and can be considered to form the channel of the transistor device 10.

In the embodiment illustrated in FIG. 1, the support layer 11 is formed of a dielectric material. The organic semiconductor layer 20 is arranged on the base 17 and the side wall 18 of the first trench 16 and lines the base 17 and sidewall 18 of the first trench 16. The source contact 14 is positioned over the entire first major surface 12 and forms a portion of the sidewall 18 of the first trench 16. The organic semiconductor layer 20 is in direct contact with the source contact 14 formed in the sidewall 18 of the first trench 16 and with the drain contact 15 that forms the base 17 of the first trench 16. The transistor device 10 further comprises a gate dielectric layer 21 which is arranged on the organic semiconductor layer 20 and which lines the sidewall 18 and base 17 of the first trench 16. The gate electrode 22 is formed of conductive material and is arranged in the first trench 16 and may fill the centre of the first trench 16 that is lined by the gate dielectric layer 21 and the organic semiconductor layer 20.

The organic semiconductor layer 20 extends between substantially perpendicularly the first and second major surfaces 12, 13. Since the gate controlled current region 19 is formed in the organic semiconductor layer 20, the current flow between the source contact 14 and drain contact 15 is substantially perpendicular to the first and second major surfaces 12, 13. A vertical organic semiconductor-based power FET (Field Effect Transistor) device 10 is provided in which the conduction occurs vertically, i.e. perpendicularly to the major surfaces 12, 13 of the support layer 11 since the source and drain contacts 13, 14 are arranged on opposing sides of the support layer 11.

The transistor device 10 further comprises a source layer 23 which is arranged on the source contact 14 and a drain layer 24 which is arranged on the drain contact 15. The source and drain layers 23, 24 may be referred to as power metals. The first trench 16 extends through the source layer 23 and the source contact 14 and through the dielectric support layer 11 to the drain contact 15. The organic semiconductor layer 20 extends over the portion of the sidewall 18 of the first trench 16 formed by the source contact 14 and the source layer 23 and also extends over the upper surface 25 of the source layer 23 in regions contiguous to the sidewall 18 of the first trench 16. Similarly, the gate dielectric layer 21 extends on the organic semiconductor layer 20 over the first major surface 12. The lateral extent of the organic semiconductor layer 20 and the gate dielectric layer 21 may be substantially the same.

A gate metal layer 26 is also provided which is arranged on the gate electrode 22 positioned within the first trench 16. The gate metal layer 26 is positioned on the regions of the gate dielectric layer 21 which are arranged on the first major surface 12. The lateral extent of the gate metal layer 26 may be substantially the same as or less than the lateral extent of the organic semiconductor layer 20 and the gate dielectric layer 21 so that the gate dielectric layer 21 spaces the conductive gate metal layer apart from the conductive source layer 23. The source layer 23 is arranged between and in direct contact with the portion of the organic semiconductor layer 20 arranged on the first major surface 12 and the source contact 14.

The first trench 16 may have either an elongate structure, in which its longest direction (length) extends into the plane of the drawing and parallel to the first major surface 12 and is greater than its depth perpendicularly to the first major surface 12 or its width, for example its length is at least twice or at least five times of its depth. Alternatively, the first trench 16 may have a columnar or needle shape having a depth in a direction perpendicular to the first major surface 12 that is greater than its lateral dimensions, e.g. width, in directions parallel to the first major surface 12, for example its depth is at least twice or at least five times its width.

The drain layer 24 may serve as a substrate onto which the structure is built up. The drain layer 24 may comprise a flexible, highly conductive foil to serve as a base substrate and as the electrical drain connection. The drain layer 24 may comprise a metal such as Cu, Al, or a conductive material such as indium-tin-oxide ITO, or a conductive polymer for example. The drain layer 24 may also assist in heat extraction and dissipation.

The drain contact 15 is formed on top of the drain layer 24 or substrate. The material of the drain contact 15 may be deposited onto the drain layer 24 and selected to provide an ohmic contact to the organic semiconductor material. The drain contact 15 may comprise Au or indium-tin-oxide (ITO), for example.

In some embodiments, an organic compound forms the dielectric or support layer 11 between source and drain potential. For example, Poly-methyl-methacrylate (PMMA) or poly-ethylene-terephthalate (PET) or PVC (Poly Vinyl Chloride) may be used.

A dielectric material for the support layer 11 is deposited onto the drain contact 15 and a material is deposited onto the dielectric support layer 11 for providing an ohmic source contact 14 to the organic semiconductor material. The source contact 14 may comprise Au or indium-tin-oxide (ITO) for example. The source layer 23 is deposited onto the source contact 14 and may be formed of a flexible, highly conductive layer. The source layer 23 may comprise a metal, such as Cu, Al, or ITO, or a conductive polymer, for example.

A first trench 16, which may have a strip- or needle-shape in top view, is formed in the stack described above, for example by etching or an alternative process to form a first trench 16 that extends through the source layer 23, source contact 14 and into the support layer 11. The first trench 16 is defined by a Lithography process and its base 17 may be positioned either on the drain contact 15 or within the support layer 11. An organic semiconductor layer 20 is deposited onto the base 17 and side wall 18 of the first trench 16, for example via spin coating, vacuum evaporation, or pulsed laser deposition. A large variety of materials could be used and applied as an organic semiconductor thin film, for example small molecules such as Oligothiophenes, Pentacene, Benzodithiophene or certain polymers.

A gate dielectric layer 21 is deposited on top of the organic semiconductor layer 20. The gate dielectric layer 21 may be formed of poly-Imide or PMMA. Alternatively, an inorganic dielectric material such as $SiO_2$ or SiN could be used as these materials have good interface qualities. The first trench 16 is then filled with a conductive material, e.g. Au, forming the gate electrode 22. Using a further lithography process the gate metal layer 26, the gate dielectric layer 21 and the organic semiconductor layer 20 are structured, e.g. etched or removed by alternative process, with a stop on the source layer 23.

A passivation layer or layers may be formed. For example, the transistor device front and backside could be isolated from the environment by an additional electrically isolating polymer layer, e.g. Poly-Imide or PMMA, which exposes regions of the source and drain layers 23, 24 to reveal the desired contact areas.

Most organic semiconductors are p-type. To achieve accumulation of holes a negative gate-source voltage must be applied. The holes accumulating in the organic semiconductor are accelerated towards Drain by a negative drain-source voltage. source-drain-blocking voltages up to 40V may be provided. In some embodiments, a field plate connected to Source, Gate or Drain may be used for optimization of the device parameters. Common drain power switch systems can also be provided.

In some embodiments, the dielectric material of the support layer 11 is replaced completely by organic semiconductor material. By varying the doping level over the depth of the organic semiconductor which provides the support layer 11, for example stepwise from N2 to N1 or graded, the blocking voltage and/or on-off current ratio of the transistor device 10 may be fine-tuned.

FIG. 2A illustrates a top view of the transistor device 10 in which the first trenches 16 have an elongate strip-like structure having a longest direction which extends parallel to the first major surface 12, in the Y direction using the Cartesian coordinate system, a width in the X direction and a depth which extends substantially perpendicular to the first major surface 12 in the Z direction. The gate electrodes 22 arranged in the first trenches 16 also have an elongate stripe-like structure having a longest direction which extends parallel to the first major surface 12 in the Y direction. As can also be seen in FIG. 2A, the transistor device 10 may include a plurality of trenches 16 which extend substantially parallel to one another.

In the arrangement of FIG. 2A, one gate metal layer 26 is provided for each first trench 16 and for each gate electrode 22. The gate metal layer 26 has an elongate strip-like form which has a longest direction extending parallel to the longest direction of the first trench 16 in the Y direction. Also seen in the top view of FIG. 2A is the lateral extent of the gate metal layer 26 which is laterally wider than the width of the first trench 16 so that a T-shaped form is provided as can be seen in the cross-sectional view of FIG. 1. A plurality of source layers 23 each having an elongate stripe-like shape with a longest direction which extends parallel to the first major surface 12 in the Y direction may be provided. Neighbouring ones of the gate metal layers 26 are spaced apart by one of the source layers 23 which is positioned on and in direct contact with the source contact 14 arranged on the first major surface 12 of the support layer 11.

FIG. 2B illustrates a top view of a transistor device 10 in which the first trenches 16 have a columnar or needle shape. The gate electrode 22 arranged in each of the first trenches 16 also has a columnar or needle shape. In this embodiment, the columnar first trenches 16 have a depth, extending in the Z direction, which is greater than the length or width in the XY plane. In this embodiment, the columnar first trench 16 has a circular form in top view. A plurality of first trenches 16 are provided which are arranged in rows or columns, each row extending in the Y direction. The gate metal layer 26 has an elongate strip-like form similar to that illustrated in FIG. 2A for the elongate first trench 16. In the embodiment illustrated in FIG. 2B, one gate metal layer 26 is provided for each row of first trenches 16 and is positioned on and extends between two or more columnar first trenches 16 arranged in that row.

In this embodiment, the elongate strip-like gate metal layer 26 provides a portion of the redistribution structure to electrically connect the gate electrodes 22 positioned in the individual columnar first trenches 16 of that row to one another. As in the arrangement illustrated in FIG. 2A, the gate metal layers 26 are spaced apart by a portion of the source layer 26 which is arranged on the source contact 14 arranged on the first major surface 12 of the support layer 11.

Figure 3:
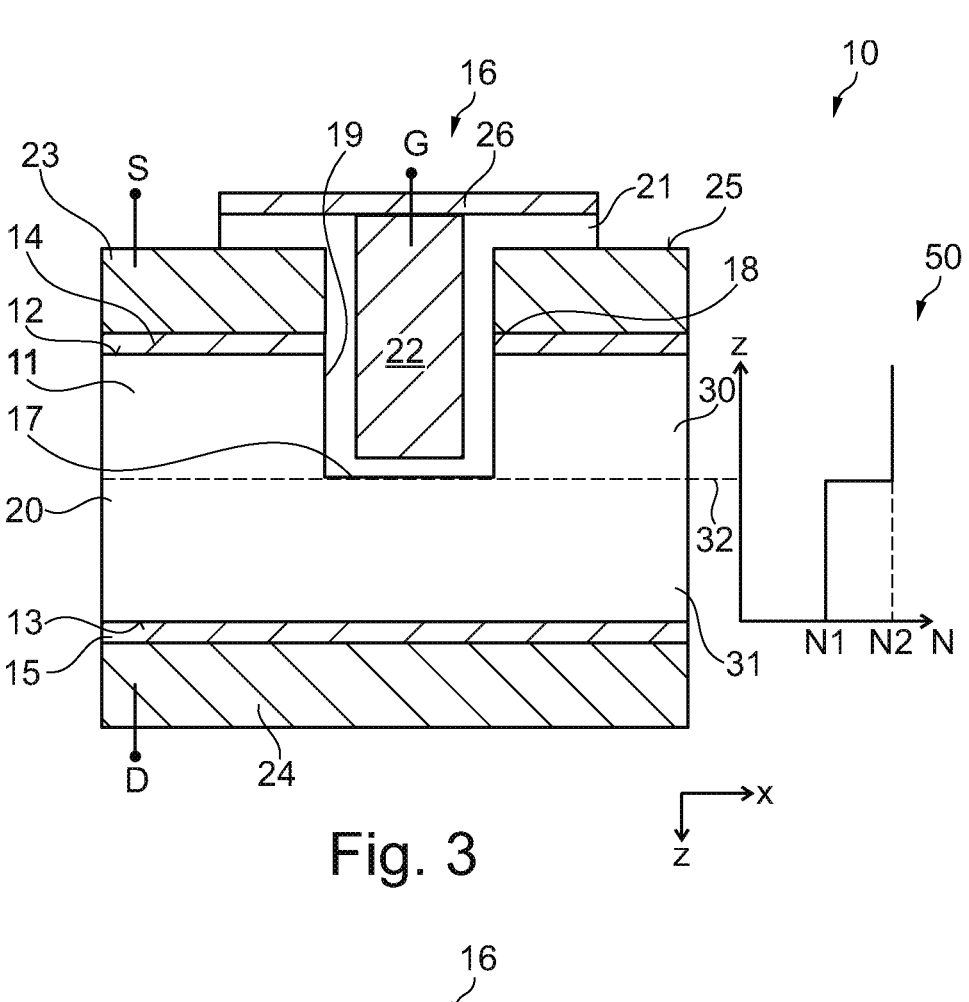
FIG. 3 illustrates a cross-sectional view of a transistor device according to an embodiment.

FIG. 3 illustrates a cross-sectional view of a transistor device 10 according to another embodiment. Similar to the embodiment described with reference to and illustrated in FIG. 1, the transistor device 10 comprises a support layer 11 having a first major surface 12 and a second major surface 13 that opposes the first major surface, a source contact 14 located on the first major surface 12 and a drain contact 15 arranged on the second major surface 13. Similarly, the transistor device 10 comprises a first trench 16 which extends into the support layer 11 from the first major surface 12 in which a gate electrode 22 is located. The drain contact 15 is positioned under the entire width of the base 17 of the trench first trench 16.

As in the embodiment illustrated in FIG. 1, the region 19 with gate-controlled conductivity is formed in an organic semiconductor layer 20 that extends between the source contact 14 and drain contact 15 arranged on the opposing sides of the support layer 11. The embodiment illustrated in FIG. 3 differs from that illustrated in FIG. 1 in that the support layer 11 is formed of an organic semiconductor material. The region 19 of gate-controlled conductivity, which may be referred to as the channel of the transistor device 10, is formed in in the organic semiconductor layer 20 that provides the support layer 11 and is formed in a vertical direction between the source contact 14 and drain contact arranged on or at opposing sides of the organic semiconductor layer 20.

The first trench 16 is lined with a gate dielectric layer 21 which extends over the sidewall 18 and base 17 of the first trench 16 and is in direct contact with the sidewall 18 and base 17 of the first trench 16 which are formed by the organic semiconductor material of the support layer 11. The gate electrode 22 is arranged on the gate dielectric layer 21 and may fill the first trench 16.

In the embodiment illustrated in FIG. 3, the gate dielectric 21 also extends over the upper surface 25 of the source layer 23 in regions contiguous to the sidewall 18 of the first trench 16. The gate metal layer 26 is arranged on the gate electrode 22 and on the gate dielectric layer 21. The lateral extent of the gate metal layer 26 may be substantially the same as or slightly smaller than the gate dielectric layer 21 such that the gate dielectric 21 electrically insulates the gate electrode 22 and the gate metal layer 26 form the source contact 14 and the source layer 23.

Similar to the embodiment illustrated in FIG. 1, a drain layer 24 is arranged on the drain contact 15 and a source layer 23 is arranged on the source contact 14 so that the source layer 23 and the drain layer 24 are arranged on opposing major surfaces 12, 13 of the organic semiconductor layer 20 which also provides the support layer 11. The first trench 16 extends through the source layer 23 and the source contact 14. The base 17 of the first trench 16 is arranged in the support layer 11 and is formed by the organic semiconductor material providing the support layer 11.

The organic semiconductor layer 20 comprises the first conductivity type and may be p-type. In this embodiment, the organic semiconductor layer 20 has dopants of the first conductivity type and two sublayers which have differing doping concentrations of the dopants of the first conductivity type. The semiconductor layer 20 has a first upper sublayer 30. The first upper sublayer 30 provides the first major surface 12 and which is arranged on and forms an interface 32 with a lower second sublayer 31 which provides the second major surface 13. The upper sublayer 30 has a doping concentration N1 which is different from the doping concentration N2 of the lower sublayer 31. In some embodiments N1 is greater than N2. In some embodiments, the interface 32 between the upper layer 30 and the lower layer sublayer 31 is located at a depth from the first major surface 12 which corresponds to the depth of the base 17 of the first trench 16 from the first major surface 12. The doping concentration of the first conductivity type within the organic semiconductor layer 20 has a stepped profile in the z-direction as shown schematically in the graph 50.

The base 17 of the first trench may be formed from the lower sublayer 31 so that the gate dielectric layer 21 arranged on the base 17 of the first trench 21 is in direct contact with the lower sublayer 31 of the organic semiconductor layer 20.

The first trench 16 may be elongate or have a columnar form, for example as shown in FIGS. 2A and 2B.

Figure 4:
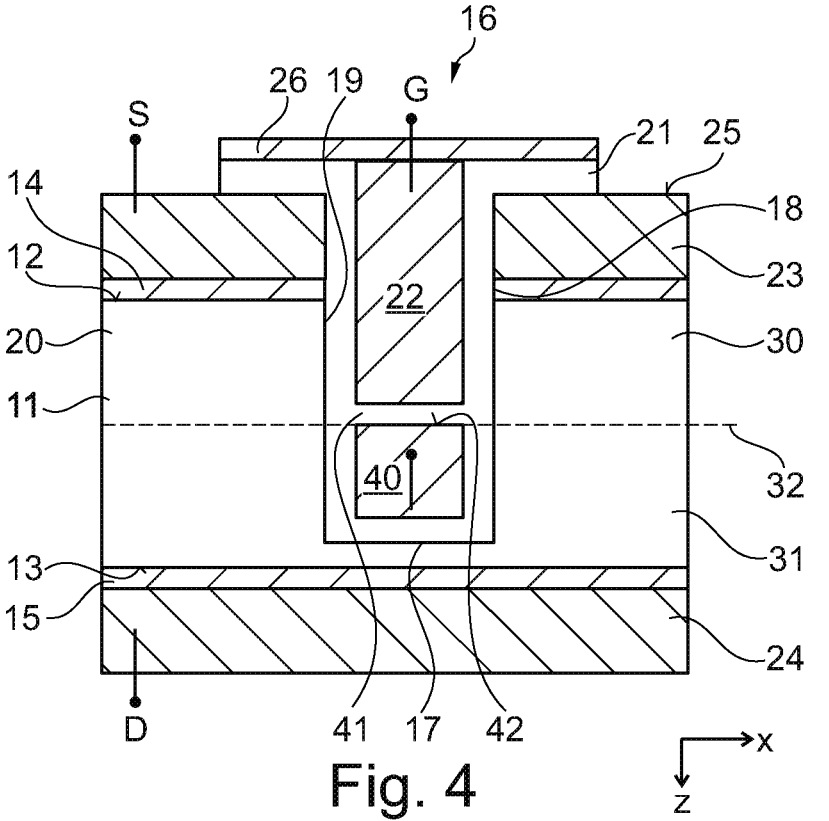
FIG. 4 illustrates a cross-sectional view of a transistor device according to an embodiment.

FIG. 4 illustrates a cross-sectional view of a transistor device 10 according to an embodiment which further comprises a field plate 40 that is arranged in the first trench 16. The field plate 40 is arranged in the lower portion of the first trench 16 and the gate electrode 22 is arranged in the upper portion of the first trench 16 above the field plate 40. The field plate 40 is formed of electrically conductive material and is electrically insulated from the organic semiconductor layer 20, which in this embodiment also provides the support layer 11, by the portion of the gate dielectric layer 21 which is positioned on the sidewall 18 and base 17 of the first trench 16. The field plate 40 is electrically insulated from the gate electrode 22 which is located above the field plate within the first trench 16 by an intermediate insulating layer 41 which is positioned on the upper surface 42 of the field plate 40.

In some embodiments, the field plate 40 is electrically insulated from the organic semiconductor layer 20 by a field insulating layer that is arranged on the base 17 and the lower portion of the side wall 18 of the first trench 16 and that has a thickness which is greater than the thickness of the gate dielectric layer 21.

In this embodiment, the depth of the first trench 16 may be greater than the depth of the first trench 16 shown in the embodiment in FIG. 3. In some embodiments, the upper surface 42 of the field plate 40 may be substantially coplanar with the interface 32 formed between the lower sublayer 31 and the upper sublayer 32 of the organic semiconductor layer 20. The base 17 of the first trench 16 is arranged within the thickness of the lower sublayer 31. In this embodiment, the base 17 is spaced apart from the drain contact 15 by a thin a portion of the second lower sublayer 31 of the semiconductor layer 20.

The field plate 40 arranged on the lower part portion of the first trench 16 may be electrically connected to source potential or be electrically floating. The field plate 40 may be electrically connected to the source layer 23 by an electrically conductive via which is positioned in the first trench 16. For example, the first trench 16 may have an elongate strip-like structure having a length in the Y direction. The field plate 40 also has an elongate strip-like structure having a length in the Y direction and a section of this length of the field plate 40 is uncovered by the gate electrode 22 and by the gate metal layer 26. In this section of the first trench 16, the upper portion of the first trench 16 may be filled with electrically insulating material. A conductive via may be formed in this section of the first trench 16 which extends through the electrically insulating material to the field plate 40 arranged in the lower portion of the first trench 16. For example, the field plate 40 may have a length which is greater than the length of the gate electrode 22 and the gate metal layer 26 such that a region of the field plate 40 arranged at an end of the trench remains uncovered by the gate electrode 22 and the gate metal layer 26. The conductive via is arranged at the end of the first trench 16 and extends to the field plate 40. The conductive via may be used to electrically couple the field plate to the source potential, for example to the source layer 23.

In embodiments in which the field plate 40 is electrically floating and is not electrically connected to another conductive part of the transistor device 10, the first trench 16 may be columnar, e.g. needle-shaped or elongate in plan view.

Figure 5:
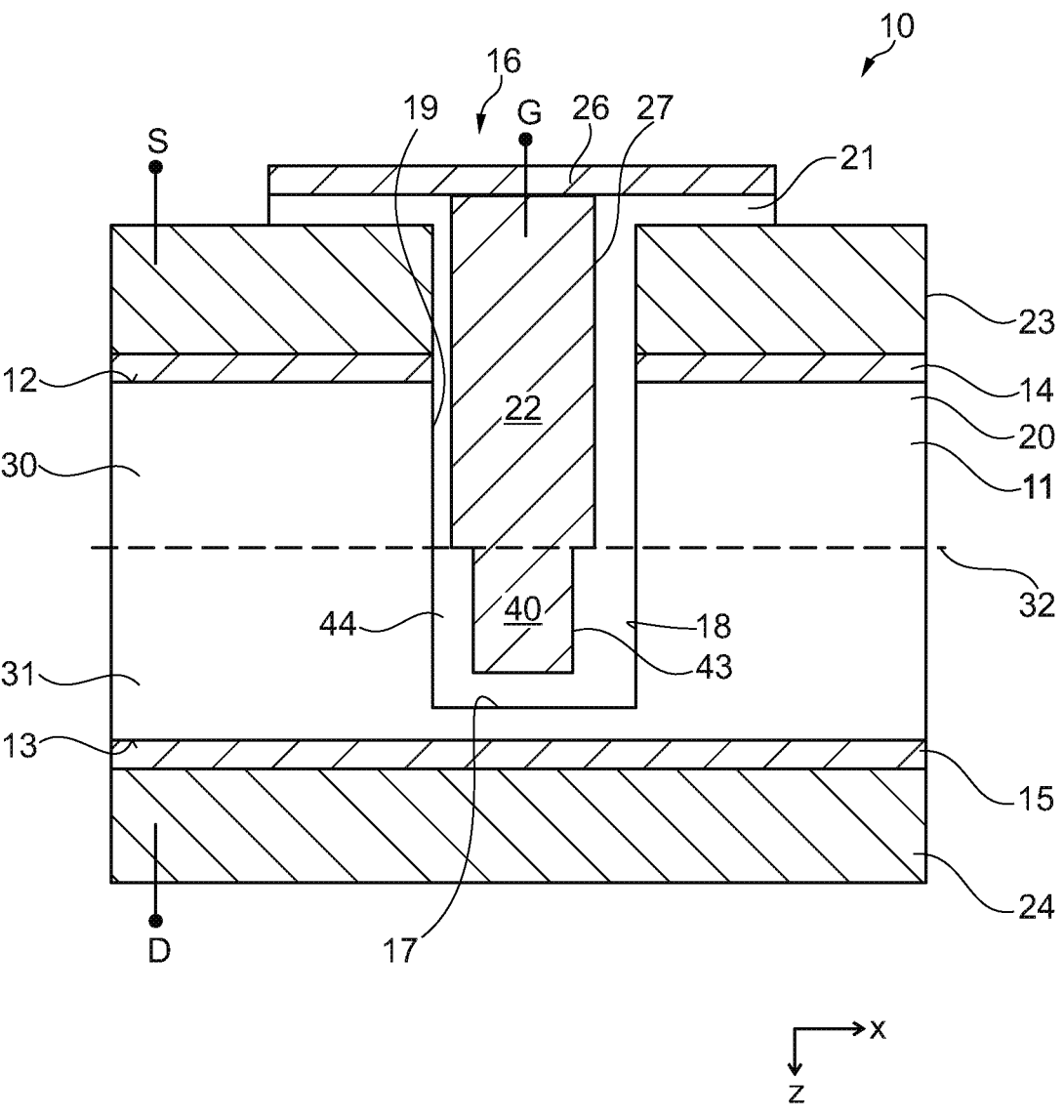
FIG. 5 illustrates a cross-sectional view of a transistor device according to an embodiment.

In some embodiments, a field plate 40 can be provided which is electrically connected to gate potential. FIG. 5 illustrates a transistor device according to an embodiment which differs from that described with reference to and illustrated in FIG. 4 in that the field plate 40 is integral with the gate electrode 22 and electrically connected to gate potential.

As can be seen from FIG. 5, the first trench 16 comprises conductive material that forms a field plate 40 arranged towards the bottom of the first trench 16 and a gate electrode 22 arranged towards the top of the trench similar to the arrangement illustrated in FIG. 4. In this embodiment, the field plate portion 40 has a width in the X direction which is less than the width in the X direction of the gate electrode portion 22 such that the thickness of the electrically insulating layer 44 between the sidewalls 43 of the field plate 40 and the sidewall 18 of the first trench 16 is greater than the thickness of the gate dielectric 21 arranged between the sidewall 27 of the gate electrode 22 and the sidewall 18 of the first trench 16. The thickness of the electrically insulating layer 44 on the base 17 of the first trench 16 may also be thicker than the thickness of the gate dielectric layer 21 arranged between the sidewall 27 of the gate electrode 22 and the sidewall 18 of the first trench 16. This thicker portion of the electrically insulating layer 44 in the first trench 16 may be referred to as a field plate dielectric.

The interface between the field plate 40 and the gate electrode 22 may have a stepped structure, with the step being substantially coplanar with the interface 32 formed between the upper and lower sublayers 30, 31 of the organic semiconductor layer 20. Alternatively, the transition between the field plate portion 40 and the gate electrode portion may be smoother and less abrupt. The first trench 16 may have an elongate shape or a columnar shape.

Figure 6:
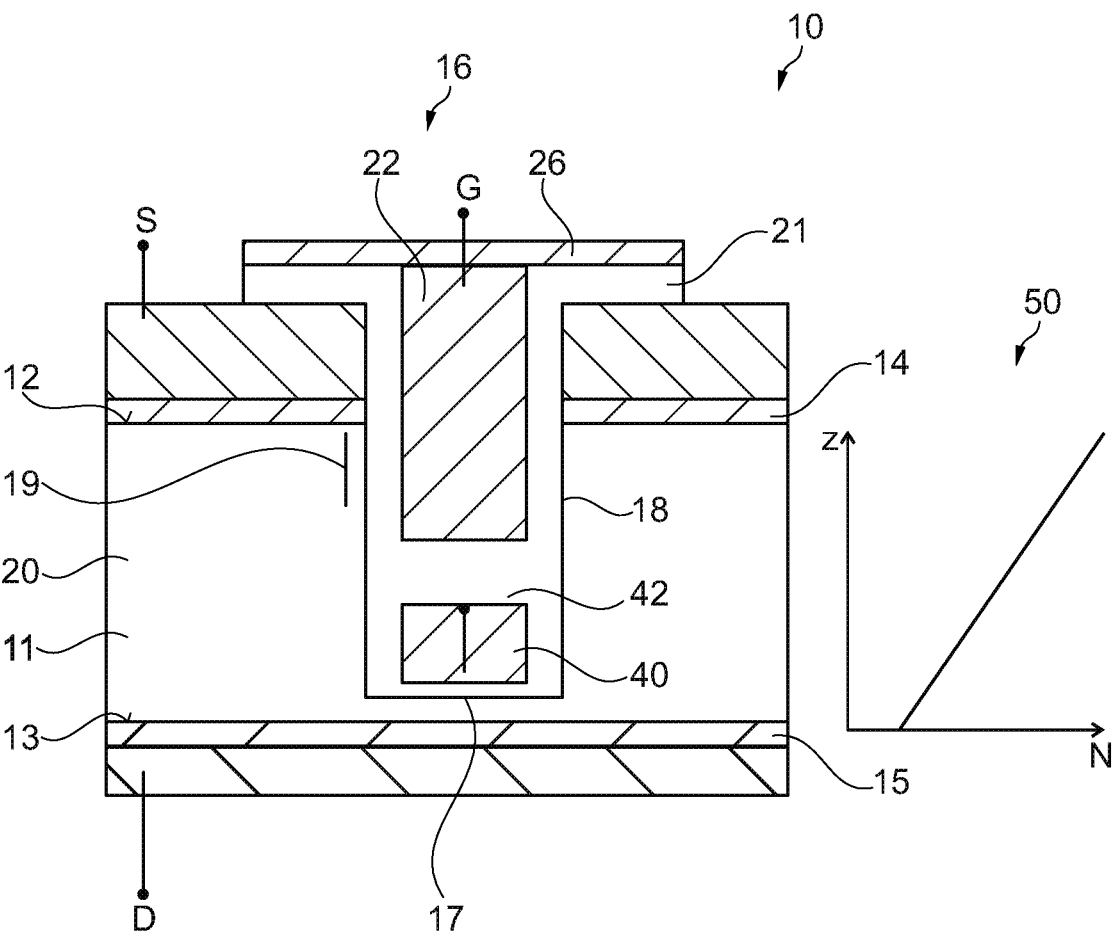
FIG. 6 illustrates a cross-sectional view of a transistor device according to an embodiment.

FIG. 6 illustrates a transistor device 10 according to an embodiment that has a structure as illustrated in FIG. 4, but which differs in the doping concentration profile of the organic semiconductor layer 20 which provides the support layer 11. In the embodiment illustrated in FIG. 6, the organic semiconductor layer 20 has a doping concentration which has a vertical doping gradient or profile, in other words, the doping profile continuously and gradually increases and is inclined. Such a doping profile can also be called a graded doping profile. As is indicated schematically with the line 50 in FIG. 6, the doping concentration increases continuously in a direction from the second major surface 13 to the first major surface 12 of the organic semiconductor layer 20 and has a positive slope or gradient rather than having a stepped form with an abrupt increase as shown in FIG. 4. In other non-illustrated embodiments, the doping concentration decreases continuously in a direction from the second major surface 13 to the first major surface 12 of the organic semiconductor layer 20 and has a negative slope or gradient.

Figure 7:
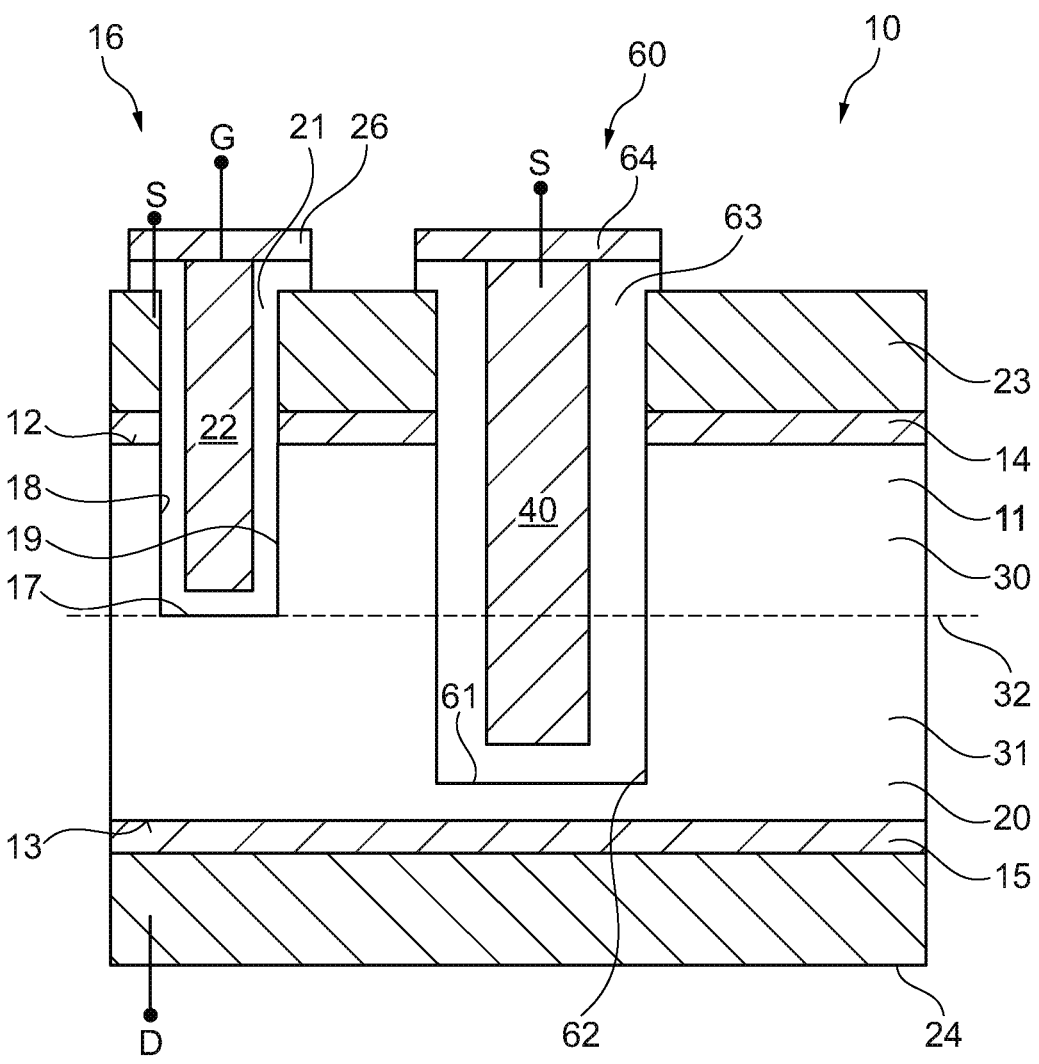
FIG. 7 illustrates a cross-sectional view of a transistor device according to an embodiment.

FIG. 7 illustrates a transistor device 10 according to an embodiment. The transistor device 10 has a similar arrangement to that illustrated in FIG. 3 and comprises a support layer 11 formed of an organic semiconductor layer 20 having an upper sublayer 30 and lower sublayer 31 of differing doping concentrations. Alternatively, the organic semiconductor layer 20 may have an inclined vertical doping profile or gradient as shown in FIG. 6. A source contact 14 and source layer 23 are arranged on the first major surface 12 and a drain contact 15 and drain layer 24 arranged on the second major surface of the organic semiconductor layer 20. The transistor device 10 also comprises a first trench 16 in which the gate electrode 22 is arranged. The gate electrode 22 is electrically insulated from the source layer 23, the source contact 14 and the organic semiconductor layer 20 by a gate dielectric 21 which lines the sidewalls 18 and base 17 of the first trench 16 and which extends over the upper surface 25 of the source layer 23 and between the gate metal layer 26 and the source layer 23.

The transistor device 10 further comprises a second trench 60 which is positioned laterally adjacent to the first trench 16 and which comprises a field plate 40. The first trench 16 comprises a gate electrode 22 only and the second trench 60 comprises the field plate 40 only so that the gate electrode 22 and field plate 40 are arranged in separate trenches that are laterally spaced apart from one another. The second trenches 60 may have a depth from the first major surface 12 of the support layer 11 which is greater than the depth of the first trenches 16 from the first major surface 12 of the support layer 11. The second trenches 60 may be elongate and have a strip-like shape or columnar or needle-shaped in top view.

The second trench 60 extends through the source layer 23, the source contact 14 and the first major surface 12 into the support layer 11 and has a base 61 and sidewall 62 which extends from the base 61 to the upper surface 25 of the source layer 23. The field plate 40 is arranged in the second trench 60 and is electrically insulated from the organic semiconductor layer 20 by a field insulator 63 which is positioned on the sidewall 62 and base 61 of the second trench 60. The field insulator 63 may have a greater thickness than the gate dielectric 21. The field plate 40 may extend to the first major surface 12 or to the upper surface 25 of the source layer 23, if present.

In some embodiments, a field plate metal layer 64 may be positioned on the field plate 40 and may extend over the contiguous regions of the first major surface 12. In some embodiments, the field plate dielectric 63 may extend over the contiguous regions of the source layer 23. The field plate metal layer 61 has a lateral extent such that its periphery is arranged above the upper surface 25 of the source layer 23 and is electrically insulated from the source layer 23 by the portion of the field insulator 63 arranged on the upper surface 25 of the source layer 23. The field plate 40 may be electrically connected to source potential. This embodiment may be used for a second trench 60 which is elongate or which has a columnar structure.

In embodiments in which the second trench 60 has a columnar structure, a plurality of second trenches 60 may be arranged in a row and the field plate metal layer 64 may be positioned on and extend between the individual ones of plurality of second trenches 60 of the row to electrically connect the field plates 40 within the individual ones of the columnar second trenches 60 to one another. The arrangement in plan view of the second trenches 60 corresponds to the arrangement of the columnar gate trenches 16 illustrated in FIG. 2B. In some embodiments, the second trenches 60 have a columnar structure and are arranged in an array of rows and columns and the first trenches 16 have an elongate structure and form a grid structure of transverse sections extending in the X direction and longitudinal sections extending in the Y direction in top view. One square of the first trench grid surrounds each second trench 60. One of the longitudinal or transverse sections of the first trench 16 and gate electrode 22 is arranged between neighbouring ones of the second trenches 60 and the field plates 40.

Figure 8A:
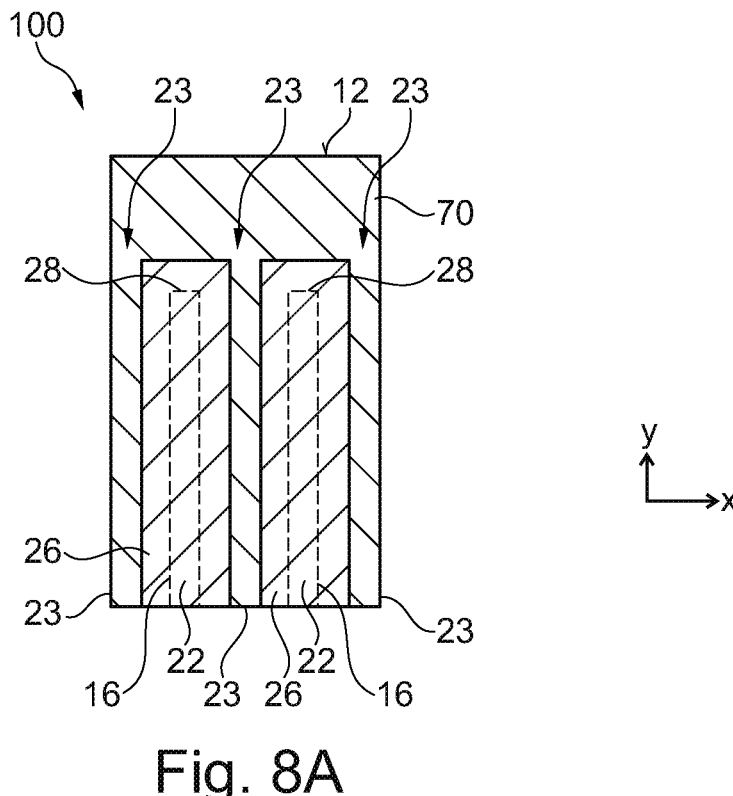
FIGS. 8A to 8C illustrate three top views of a semiconductor device which may have the cross-sectional structure according to any one of FIGS. 1 and 3 to 6.
Figures 8B, 8C:
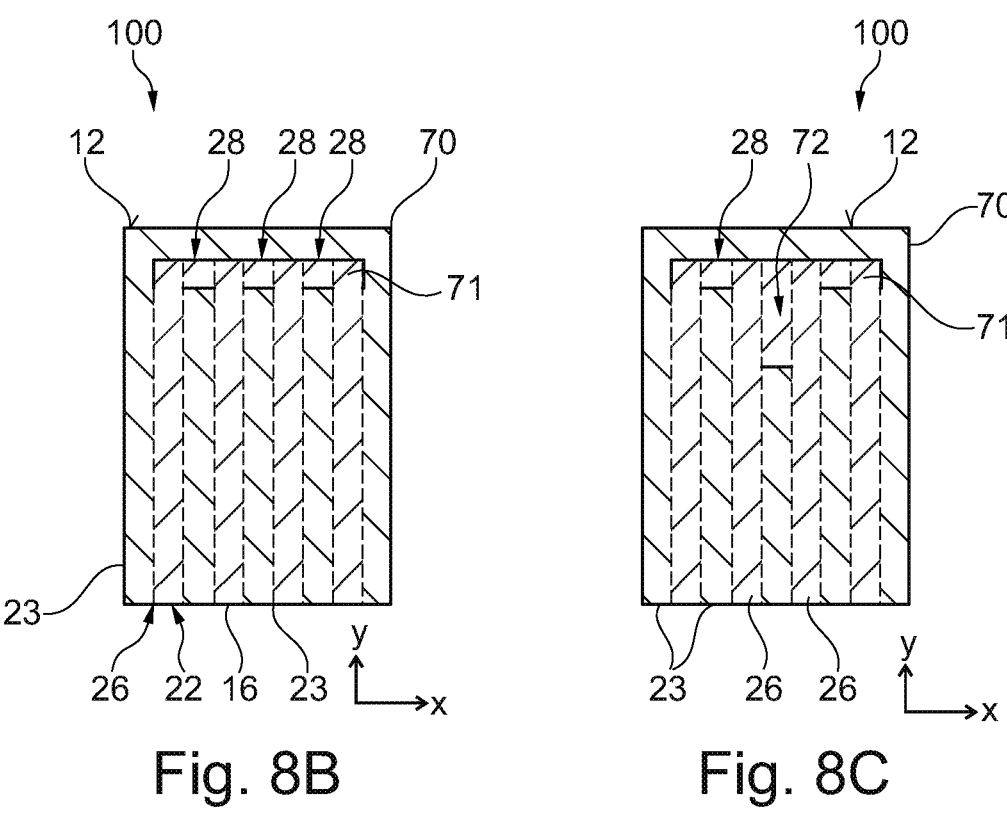

FIGS. 8A to 8C illustrate top views of transistor devices in which the metallization structure 100 arranged on the first major surface 12 can be seen. The metallization structure 100 includes the source layers 23, gate metal layers 26 and, in some embodiments, one or more source buses and one or more gate buses.

FIG. 8A illustrates a portion of the first major surface 12 and illustrates two elongate first trenches 16 in which a gate electrode 22 is positioned. One elongate strip-like gate metal layer 26 is arranged above and aligned with each of the first trenches 26. The gate metal layers 26 are spaced apart by a portion of the source layer 23. The gate metal layers 26 are each laterally wider than the corresponding one of the first trenches 16 and extend laterally beyond the sidewall 18 of the first trench 16 in the X direction and beyond the distal end 28 of the first trenches 16 in the Y direction. The gate metal layers 26 are electrically insulated from the source layer 23 by an intervening portion of the gate dielectric layer 21 in both the X and Y directions. A plurality of stacks of an elongate stripe-like source contact 14 and elongate strip-like source layer 23 is arranged between adjacent ones of the first trenches 16.

The separate source layers 23 electrically connected to one another by a source bus 70 which is arranged on the first major surface 12 and which extends between adjacent ones of the source layers 23. The longest dimension of the source layer 23 extends in the X direction. In some embodiments, the source layer 23 and the source bus 70 may be formed in a single conductive layer arranged on the first major surface 12. The source bus 70 may also be arranged under the periphery of the source metal gate metal layer 26 that extends over the distal end 28 of the first trenches 16.

FIG. 8B illustrates a top view of a portion of the first major surface 12 including a plurality of elongate first trenches 16, each including a gate electrode 22. In this embodiment, an individual gate metal layer 26, which is arranged on each of the first trenches 16, has a lateral area which is substantially the same as the lateral area of the first trench 16. In this embodiment, the gate electrode 22 may be recessed within the first trench 16. An individual source layer 23 is arranged between adjacent ones of the first trenches 16 and may extend between the side wall 18 of adjacent ones of the first trenches 16. FIG. 8B illustrates a gate bus 71 which extends between the distal ends of adjacent ones of the gate metal layers 26. The gate bus 71 extends in the X direction with the longest length of the first trenches 16 and gate electrodes 22 and gate metal layers 26 extending in the Y direction. The source bus 70 extends between the distal ends of the individual ones of the source layers 23. The source bus 70 extends between two outermost source layers 23. Source bus 70 extends in the X direction and is arranged laterally adjacent to the gate bus 71. In the embodiment illustrated in FIG. 8B, the gate metal bus 71 has a strip-like form having a width in the Y direction which is substantially uniform. The gate bus 71 is electrically insulated from the source layers 23 underneath by an intervening electrically insulating layer which may be the gate dielectric layer 21 and/or a further electrically insulating layer.

FIG. 8C illustrates a top view of a portion of the first major surface 12 according to another embodiment which is similar to the arrangement illustrated in FIG. 8B but differs in the shape of the gate metal bus 71. In the embodiment illustrated in FIG. 8C, the gate bus 71 has an increased width in the Y direction towards its central portion. The gate bus 71 may overlap one or more of the source layers 23 by an increased distance in order to create an enlarged area that is able to serve as a gate pad 72. The gate bus 71 is electrically insulated from the source layers 23 underneath by an intervening electrically insulating layer which may be the gate dielectric layer 21 and/or a further electrically insulating layer.

To summarise, structures and methods for forming a vertical power field effect transistor based on organic semiconductor material are provided. A Needle or Stripe dense trench layout for increased channel width and power applications may be used. The transistor device has a transistor cell structure and a frontside and backside conductive layer for high current carrying capability in power applications. The transistor devices are light weight and may be used in application such as wearable electronics, Internet of Things. The transistor devices may be flexible to provide a foldable power switch with a small radius of curvature, for example of 100 μm. Depending on final material composition, the device may be biodegradable.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise. It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A transistor device, comprising:
a support layer having a first major surface and a second major surface opposing the first major surface;
a source contact arranged on the first major surface of the support layer;
a drain contact arranged on the second major surface of the support layer;
a gate electrode arranged in a first trench formed in the first major surface of the support layer, the first trench having a base and a side wall extending from the base to the first major surface, wherein the drain contact is arranged under the base of the first trench; and
a region with gate-controlled conductivity formed between the source contact and the drain contact, wherein the region with gate-controlled conductivity is formed in an organic semiconductor layer.

2. The transistor device of claim 1, wherein the support layer is formed of a dielectric material and the organic semiconductor layer is arranged on the base and sidewall of the first trench, wherein a gate dielectric layer is arranged on the organic semiconductor layer on the base and the side wall of the first trench and electrically insulates the gate electrode arranged in the first trench from the organic semiconductor layer.

3. The transistor device of claim 2, wherein the source contact is located adjacent the side wall of the first trench, the organic semiconductor layer further extends over a part of the source contact, and the gate dielectric layer extends over the organic semiconductor layer that is arranged on the source contact.

4. The transistor device of claim 3, further comprising:
a source layer arranged on the source contact and between the source contact and the organic semiconductor layer that is arranged on the source contact; and
a drain layer arranged on the drain contact.

5. The transistor device of claim 1, wherein the support layer is formed of an organic semiconductor and a gate dielectric layer is arranged on the base and side walls of the trench and electrically insulates the gate electrode from the support layer.

6. The transistor device of claim 5, wherein the source contact is located adjacent the side wall of the first trench and the gate dielectric layer further extends over a part of the source contact.

7. The transistor device of claim 6, further comprising a source layer arranged on the source contact between the source contact and the gate dielectric layer that is arranged on the source contact.

8. The transistor device of claim 5, wherein the support layer has an upper sublayer and a lower sublayer and the upper sublayer and the lower sublayer have different doping concentrations or the support layer comprises a vertical doping gradient.

9. The transistor device of claim 5, further comprising a field plate arranged in the first trench under the gate, the field plate being electrically insulated from the support layer by a field insulator.

10. The transistor device of claim 9, wherein the field plate is electrically insulated from the gate electrode by an intermediate insulating layer arranged in the first trench or the field plate is integral with the gate electrode.

11. The transistor device of claim 5, further comprising a second trench positioned laterally adjacent the first trench and that extends into the first major surface of the support layer and has a base and a side wall that extends from the base to the first major surface, wherein a field plate is arranged in the second trench and is electrically insulated from the support layer by a field insulator that lines the base and side walls of the second trench.

12. The transistor device of claim 1, wherein the first trench is elongate or columnar.

13. The transistor device of claim 1, further comprising a gate metal layer arranged on the gate electrode in the first trench, wherein the gate metal layer and the source contact each have an elongate strip-like structure and extend substantially parallel to one another on the first major surface of the support substrate.

14. The transistor device of claim 13, wherein the first trench is columnar and the gate metal layer extends over the first trench and electrically connects the first trench to another columnar trench.

15. A method for fabricating a transistor device, the method comprising:
forming a drain contact on a drain layer;
forming an organic semiconductor layer on the drain contact;
forming a source contact on the organic semiconductor layer;
forming a source layer on the source contact;
forming a first trench that extends through the source layer, the source contact and into the organic semiconductor layer, the first trench having a base and a side wall;
forming a gate dielectric layer on the base and the side wall of the first trench; and
forming a gate electrode on the gate dielectric layer in the first trench.

16. A method for fabricating a transistor device, the method comprising:
forming a drain contact on a drain layer;
forming a dielectric layer on the drain contact;
forming a source contact on the dielectric layer;
forming a source layer on the source contact;
forming a first trench that extends through the source layer, the source contact and into the dielectric layer, the first trench having a base and a side wall;
forming an organic semiconductor layer on the base and the side wall of the first trench;
forming a gate dielectric layer on the organic semiconductor layer; and
forming a gate electrode on the gate dielectric layer in the first trench.

* * * * *